United States Patent [19]
Heath et al.

[11] Patent Number: 5,487,027
[45] Date of Patent: Jan. 23, 1996

[54] PROCESS AND APPARATUS FOR PROVIDING AN ANALOG WAVEFORM SYNCHRONIZED WITH AN INPUT SIGNAL

[75] Inventors: Michael C. Heath; Steve C. Southward, both of Cary, N.C.

[73] Assignee: Lord Corporation, Cary, N.C.

[21] Appl. No.: 245,719

[22] Filed: May 18, 1994

[51] Int. Cl.$^6$ .................. G06G 7/16; G06J 1/00
[52] U.S. Cl. ............................ 364/851; 364/607
[58] Field of Search ........................ 364/851, 607, 364/721; 327/105, 129

[56] References Cited

U.S. PATENT DOCUMENTS

| | | | |
|---|---|---|---|
| 4,027,264 | 5/1977 | Gutleber | 328/167 |
| 4,153,815 | 5/1979 | Chaplin et al. | 179/1 P |
| 4,494,551 | 1/1985 | Little, III et al. | 128/696 |
| 4,551,683 | 11/1985 | Matsuo et al. | 328/167 |
| 4,562,589 | 12/1985 | Warnaka et al. | 381/71 |
| 4,633,425 | 12/1986 | Senderowicz | 364/825 |
| 4,677,676 | 6/1987 | Eriksson | 381/71 |
| 4,689,821 | 8/1987 | Salikuddin et al. | 381/71 |
| 4,878,188 | 10/1989 | Ziegler, Jr. | 364/724.01 |
| 4,950,966 | 8/1990 | Moulds, III | 318/561 |
| 4,954,785 | 9/1990 | Segaram | 328/167 |
| 5,028,887 | 7/1991 | Gilmore | 331/18 |
| 5,121,069 | 6/1992 | Burns et al. | 328/27 |
| 5,170,433 | 12/1992 | Elliott et al. | 381/47 |
| 5,177,484 | 1/1993 | Bruckmann | 341/172 |
| 5,247,469 | 9/1993 | McCune, Jr. | 364/721 |
| 5,281,863 | 1/1994 | Bond et al. | 327/105 X |

*Primary Examiner*—Tan V. Mai
*Attorney, Agent, or Firm*—Randall S. Wayland; Richard K. Thomson

[57] ABSTRACT

A waveform generator (20) for generating an analog wave which is synchronized with a signal from an input source (22). The waveform generator (20) includes a phase-locked loop (24) for receiving an input source signal and multiplying said signal by a multiplier. The multiplied square wave signal is then provided to a frequency divider (28) and to a first clock input (39) of a first switched-capacitor filter (29). The frequency divider (28) outputs a divided output signal that is received as an input to the phase-locked loop (25) and by the first switched-capacitor filter (35). As a result, the first switched-capacitor filter (29) outputs a first analog wave of a constant amplitude which is phase synchronized with the input source signal. This waveform generator (20) allows the 3 dB point of the filter to move as the input frequency changes. Further embodiments allow the addition of second switched-capacitor filter (50) and a shift register (45) for providing a second analog wave which is phase shifted from said input source signal yet is synchronized therewith.

22 Claims, 2 Drawing Sheets

PROCESS AND APPARATUS FOR PROVIDING AN ANALOG WAVEFORM SYNCHRONIZED WITH AN INPUT SIGNAL

FIELD OF THE INVENTION

This invention relates to the area of waveform generators. Specifically, the invention relates to the area of providing a waveform that is synchronized with an input source signal.

BACKGROUND OF THE INVENTION

Digital waveform generators which take an input signal from a source and generate a sinusoidal output are known. One such digital harmonic generator is described in U.S. Pat. No. 4,950,966 to Moulds, III. U.S. Pat. No. 4,878,188 to Zeigler, Jr. also describes an all digital implementation for generating sine and cosine waves.

Vibration isolation and sound isolation systems are also well known in the art. These systems utilize microprocessors to supply canceling waves to control or minimize vibration or sound within a defined area responsive to an external input signal. Examples of such systems are taught in U.S. Pat. Nos. 4,677,676 to Eriksson, 4,153,815 to Chaplin, 4,562,589 to Warnaka et al., 5,170,433 to Elliott, and 4,689,821 to Salikudden et al. which are hereby incorporated by reference herein. In these systems, the control scheme that is used can be least mean square (LMS), Filtered-X LMS, or the like.

In active control systems of the above-mentioned type, it is required to have an input signal to the microprocessor which is indicative of the frequency content of the input source. Particularly, it is required to have at least one analog wave that is synchronized with the source input signal for providing the appropriate information to the processor. All digital implementations for providing the sine and cosine waves are available and utilize lookup tables. However, all digital implementations add additional processing load to the microprocessor. Thus, they take away from the speed of the processing. As a result, the processor has less time to spend calculating and adapting the filter weights and otherwise attempting to minimize the noise and/or vibration.

U.S. Pat. Nos. 4,551,683 to Matsuo et al., 5,121,069 to Burns et al., and 4,633,425 to Senderowicz describe the use of switched-capacitor filters and are hereby incorporated by reference herein. U.S. Pat. No. 4,027,264 to Gutleber provides an interference canceling system which utilizes a phase-locked loop and is hereby incorporated by reference herein. However, none of the prior art systems provide a waveform generator for providing an analog wave which is frequency insensitive and which does not add additional computational load to the microprocessor.

SUMMARY OF THE INVENTION

In light of the benefits and drawbacks of the prior waveform generation systems, the present invention provides an analog waveform generator for providing an analog wave to a processor whereby said wave is phase synchronized with an input signal from an input source. The waveform generator of the present invention has particular utility in the area of active sound and vibration control. It is an aspect of the present invention that multiple analog waves may be generated which are synchronized in frequency with the input source yet out of phase with each other. Such multiple waves are needed in most instances for input to the microprocessor for active noise and vibration control systems.

It is a key advantage of the present invention that the waveform generator can adjust the 3 dB roll off point of a switched-capacitor filter such that the filter follows the frequency of the input signal as the input source varies in frequency and, therefore, provide an output signal that is of constant amplitude as a function of frequency.

It is an advantage of the present invention that the waveform generator can provide an analog output, which has a constant phase and amplitude as the frequency of the input signal varies, to an active noise or vibration control system.

It is a feature of the present invention to provide a waveform generator, comprising a phase-locked loop having a first phase-locked loop input for receiving an input signal from a source, a second phase-locked loop input, and a phase-locked loop output for outputting a multiplied square wave signal whose frequency is a multiple of said input signal frequency, a frequency divider having a frequency divider input for receiving said multiplied square wave signal from said phase-locked loop, a frequency divided output including at least one divided output signal, one of said at least one divided output signal(s) being received by said second phase-locked loop input of said phase-locked loop, and a first switched-capacitor filter having a first clock input for receiving said multiplied square wave signal from said phase-locked loop, a first switched-capacitor filter input on said first switched-capacitor filter for also receiving one of said at least one divided output signals, and a switched-capacitor filter output for outputting a first analog wave which is synchronized to said input signal.

The above-mentioned and further features and advantages of the present invention will become apparent from the accompanying descriptions of the preferred embodiments and attached drawings.

BRIEF DESCRIPTION OF THE DRAWINGS

The accompanying drawings which form a part of the specification, illustrate several embodiments of the present invention. The drawings and description together, serve to fully explain the invention. In the drawings.

DETAILED DESCRIPTION OF THE INVENTION

Figure 1:
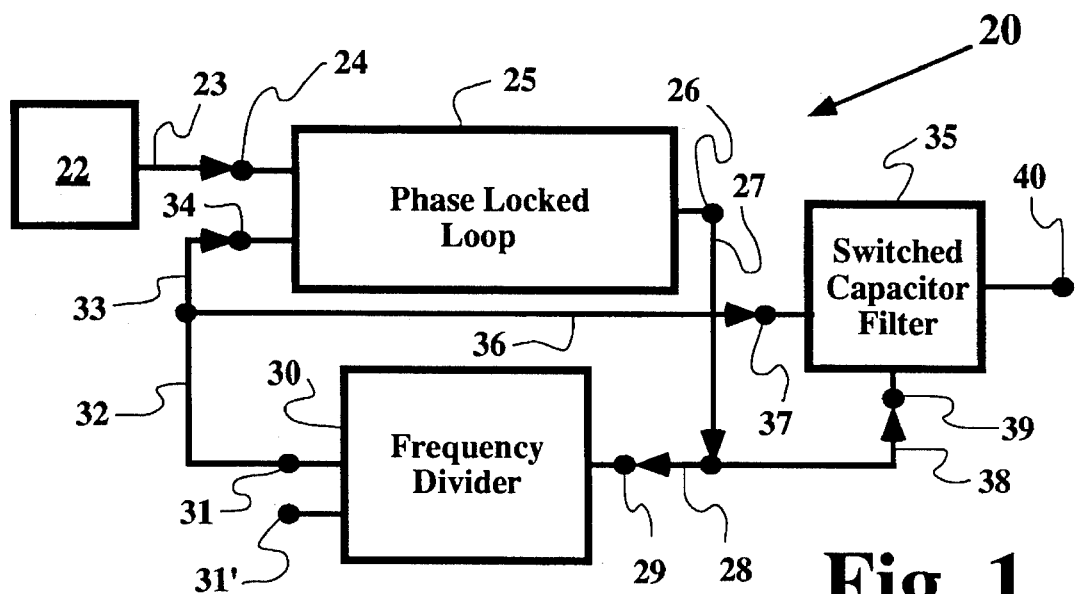
FIG. 1 is a block diagram illustrating the present invention waveform generator for outputting a synchronized analog signal.

The block diagram of FIG. 1 illustrates a waveform generator 20 comprising a phase-locked loop 25 which receives an input signal from an input source 22. The output of the phase-locked loop 25 is passed through a frequency divider 30. Sequentially, the output of the frequency divider 30 is then transmitted to a first switched-capacitor filter 35. This waveform generator 20 is ideal for providing an analog input to the feed-forward path of an active tonal controller in a noise or vibration control system. The output of the switched-capacitor filter 35 is an analog wave, such as a cosine or sine wave, which is either in phase or has a constant phase relationship with the input source 22.

In more detail, the phase-locked loop 25 includes a first phase-locked loop input 24 for receiving a signal from the input source 22 through first line 23. The input signal can be derived from a tachometer signal, an accelerometer signal, a filtered microphone signal, or any like device for providing a signal indicative of the tonal or vibrational frequency of the input noise or vibration to be canceled. It should be understood that each type of input may require signal conditioning, filtering, or amplifying as would be apparent to one of skill in the art. The phase-locked loop 25 outputs a signal 26. The signal 26 is a multiplied square wave whose frequency is a multiple of the input signal frequency from input source 22. By way of example, and not by limitation, the output of the phase-locked loop 25 is 128 times (hereinafter denoted 128×) the input fundamental frequency of the input source 22.

The phase-locked loop 25 used was an MC14046B integrated circuit (IC) manufactured by Motorola. This phase-locked loop 25 is a self-contained system comprising a phase detector which compares the phase error between the two phase-locked loop inputs, 24 and 34, and generates an internal voltage which drives an internal voltage-controlled oscillator. The voltage controlled oscillator resultantly generates a square wave signal output whose frequency is controlled by the internally generated voltage. External components such as resistors and capacitors are connected to the phase-locked loop 25 by method known to those of skill in the art in order to control the stability and frequency range of the phase-locked loop 25.

The function of the phase-locked loop 25 is to provide a frequency output signal which is locked in phase and frequency with the input source 22. A simple implementation of the phase-locked loop 25 would be to connect the phase-locked loop output 26 to the second phase-locked loop input 34 thereby producing a signal of the same frequency as the phase-locked loop output 26 which is locked in phase with input 24. A multiplied output can be obtained at the phase-locked loop output 26 by dividing it by some multiple or submultiple amount and inputting this divided signal into the second phase-locked loop input 34. The phased locked loop 25 will thereby adjust its output frequency in the inverse manner as the divider multiple or submultiple. The result is to cause the frequency of the second phase-locked loop input 34 to be equal to the first phase-locked loop input 24.

Upon exiting the phase-locked loop 25, the multiplied square wave signal is then transmitted through a second line 27 which splits into third line 28 and fourth line 38. The signal from the third line 28 is received at a frequency divider 30 which includes a frequency divider input 29. The fourth line 38 leads to a first switched-capacitor filter 35 to be described later.

The frequency divider 30 implemented was a 14-bit binary counter, part number MC14020B, manufactured by Motorola. This frequency divider 30 contains a series of flip-flops which are clocked by the frequency divider input 29. The output of each flip-flop divides the clock frequency by a factor of 2 thereby producing outputs which divide the frequency of the frequency divider input 29 by between 2 and $2^{14}$ (two to the 14th power). Therefore, since the phase-locked loop 25 has multiplied the input source 22 frequency in this application by a factor of 128, the 1× (1 times) output at the second phase-locked loop input 34 requires that the $2^7$ output of the frequency divider 30 be used at the first frequency divider output 31. For a 2× and 4× signal, the $2^6$ and $2^5$ outputs would be used. These outputs could be used for other computational reasons to be discussed later. A 2× or 4×, etc., signal could be output on corresponding frequency divider output 31' if needed.

Again referring to FIG. 1, the frequency divider 30 includes at least one divided output 31, 31' from which emanates a divided output signal. The output of the frequency divider 30 is transmitted through fifth line 32 and splits into sixth line 33 and seventh line 36. One of the at least one output signals from frequency divider output 31 is received by a second phase-locked loop input 34 of the phase-locked loop 25 via lines 32 and 33.

Second phase-locked loop input 34 provides the phase detector input which compares the phase error between the two phase inputs, 24 and 34, and generates an internal voltage which drives a voltage-controlled oscillator. This locks the second phase-locked loop input 34 to the frequency to the input source 22.

The divided square wave signal from one of the at least one divided outputs 31 is also received at the first switched-capacitor filter input 37 of the first switched-capacitor filter 35 via line 36.

The switched-capacitor filter 35 used in this implementation was a MF10 or alternately an MF100 which are manufactured by National Semiconductor. This switched-capacitor filter uses a first clock input 39 to switch internal capacitors and amplifiers contained in the switched-capacitor filter 35 so as to provide a filter function such as low-pass, high-pass, band-pass, or the like. The clock frequency determines the frequency response of the first switched-capacitor filter 35. For this switched-capacitor filter 35, a low-pass filter implementation would have a 3-dB breakpoint of about 1/100 of the clock frequency. External resistors and capacitors are connected to the switched-capacitor filter 35 per a data book, as know to those of skill in the art, to determine the type of filter and the filter shape characteristics.

For this implementation a 4th order Chebyshev low-pass filter was selected. The switched-capacitor filter 35 has a unique feature over analog filters in that the shape of the filter does not change with the clocking frequency yet the clocking frequency controls the frequency response. The switched-capacitor filter 35 is used here to pass the fundamental component of the square wave input from the frequency divider 30 while suppressing the odd order harmonics, thereby, producing a relatively pure sinusoidal analog output, for example a cosine wave.

The signal which is received by the first switched-capacitor filter 35 is of the same frequency of the input source 22, yet is in square waveform. However, it should be recognized that multiples of the input signal are also possible as divided outputs from the frequency divider 30, such as 2×, 4×, 8×, 16×, 32×, 64×etc.

The first switched-capacitor filter 35 also includes a first clock input 39 for receiving said multiplied square wave signal from the phased locked loop 25 via line 38. The first switched-capacitor filter 35 also includes a switched-capacitor filter output 40 which outputs a first analog wave which is synchronized to the input signal derived from the input source 22.

The usefulness of the switched-capacitor filter 35 was exploited in this embodiment by utilizing the fact that the 3-dB frequency response was controlled by the first clock input 39 and the filter shape remained the same within the pass band. Thereby, when the input source 23 changed frequency, the frequency response of the switched-capacitor filter 35 also changed in the same proportion, yet the amplitude of the output was constant. This is because the shape of the filter response remained the same. Because of this, the waveform generator 20 utilizing a first switched-capacitor filter 35 offers an advantage over standard analog filters. In analog filters, the 3-dB frequency response is constant, i.e., it cannot change with input frequency. In standard analog filters, for input signals in the low frequency range of the pass-band of the filter, the odd order harmonics of the square wave input signal will be less attenuated thereby degrading the purity of the outputted analog waveform. For example, the 3rd harmonic may fall within the pass band. Allowing the 3-dB point to move with frequency as in the present invention eliminates this problem of not properly attenuating the 3rd harmonic.

The characteristics of the switched-capacitor filter 35 of having the shape of the pass-band unchanged with frequency of the first clock input 39 was further exploited by producing an underdamped response within the pass band of the filter. The pass band can be adjusted such that an amplitude ripple, of 10 dB for example, can be realized near the band edge of the filter. Thereby, by using a count of 128× instead of 100 times the input source 22 frequency and employing the underdamped response, further attenuation of the odd order harmonics can be realized. The result is the creation of an outputted analog waveform of higher purity.

Figure 2:
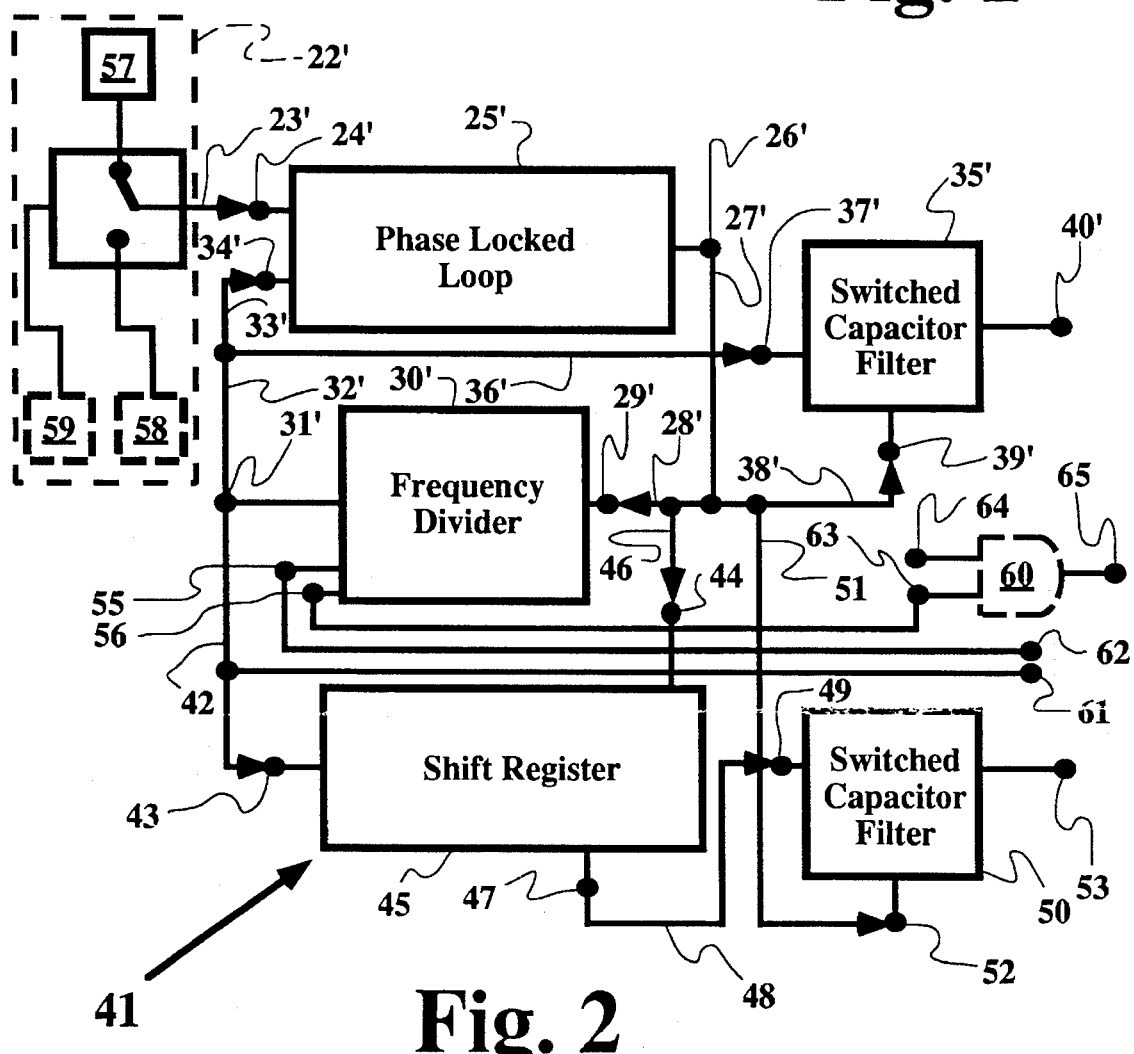
FIG. 2 is a block diagram illustrating a waveform generator for outputting two synchronized analog signals.

FIG. 2 illustrates an embodiment of waveform generator 41 which outputs two analog signals that are Synchronized with an input source 22' yet are out of phase with each other. This embodiment is similar in makeup to the first embodiment of FIG. 1, except that it includes a second switched-capacitor filter 50 and a shift register 45. The second embodiment of waveform generator 41 includes an input source 22', a phase-locked loop 25', a frequency divider 30', and a first switched-capacitor filter 35', where like numerals denote like elements as compared to the first embodiment. However, in the multiple output embodiment, one of the at least one divided output signals from the frequency divider 30' is also fed into a first shift register input 43 of a shift register 45 through eighth line 42.

The shift register 45 also includes third clock input 44 for receiving the multiplied square wave signal from the phase-locked loop 25' via a ninth line 46.

The shift register 45 selected was a MC14517B integrated circuit (IC) manufactured by Motorola. This shift register 45 contains a series of flip-flops which are controlled by the third clock input 44. The input of each flip-flop receives the output of the preceding flip-flop and the third clock input 44 controls each flip-flop, thereby perpetuating the flip-flop outputs to the next flip-flop in the series and thereby implementing a shifting function. The stages of the shift register 45 are so connected to the output pins as to provide outputs at every 16, 32, and 64 stages, etc. The 128× signal is input at the third clock input 44 and the 1× signal in input on the first shift register input 43 as it is received from the frequency divider 30'. The 1× signal is shifted 32 counts out of 128 or by ¼ period within the shift register 45. The shift register output signal 47 is input to the second switched-capacitor filter 50 via tenth line 48. The second switched-capacitor filter 50 also includes a second clock input 52 for receiving a multiplied square wave signal from the phase-locked loop 25' via an eleventh line 51. The shift register output 47 is filtered by the second switched-capacitor filter 50 to remove the odd-ordered harmonics. The result is a 90-degree shifted sinusoidal waveform, for example a sine wave. The second switched-capacitor filter 50 includes a second capacitor filter output 53 for outputting a second analog wave which is phase shifted from said first analog wave which is outputted from said first switched-capacitor filter 40'.

This shift register 45 and second switched-capacitor filter 50 in combination provide that the second analog wave is phase shifted from said first analog wave by a predetermined amount or phase angle, yet is synchronized to the input signal from the input source 22'. By synchronized, it is meant that the second analog wave is of the same frequency as the input signal, albeit it may be out of phase therewith. By way of example and not by limitation, the first and second signals may be phase shifted by 90 degrees, the first analog signal being a cosine wave and the second analog signal being a sine wave. This is accomplished by using a shift count of 32 out of 128 total counts within the shift register 45. Of course, the second analog signal could be shifted by any phase angle desirable.

This type of waveform generator 41 is very useful for providing two analog inputs such as a sine and cosine wave to a processor for use in an active vibration control or active noise control system and specifically in tonal control situations. The sine and cosine waves are synchronized with the tonal input source 22'.

The at least one output from the frequency divider 30' may include further frequency divider outputs 55 and 56 to provide further outputs to the processor. For instance, the frequency divider 30' may include a 1× signal at port 61 and a 2× output at port 62 that are output to a processor to facilitate determination of the quadrant or phase of the first analog wave outputted from the first switched-capacitor filter 40'. Furthermore, a 4× signal may be used to trigger the processor (not shown) to calculate the LMS adaptation coefficients or weights. A 4× output or other multiples from port 63 can be input to an interrupt device 60. The interrupt device 60 or AND gate can be used to selectively interrupt the signal from the frequency divider by inputting a control signal into port 64. The port 65 is connected to a single interrupt input on the processor (not shown) and can be OR gated with other waveform generator outputs at port 65. This is useful for processing multiple tones in a "batch mode" by the LMS control processor.

Figure 3:
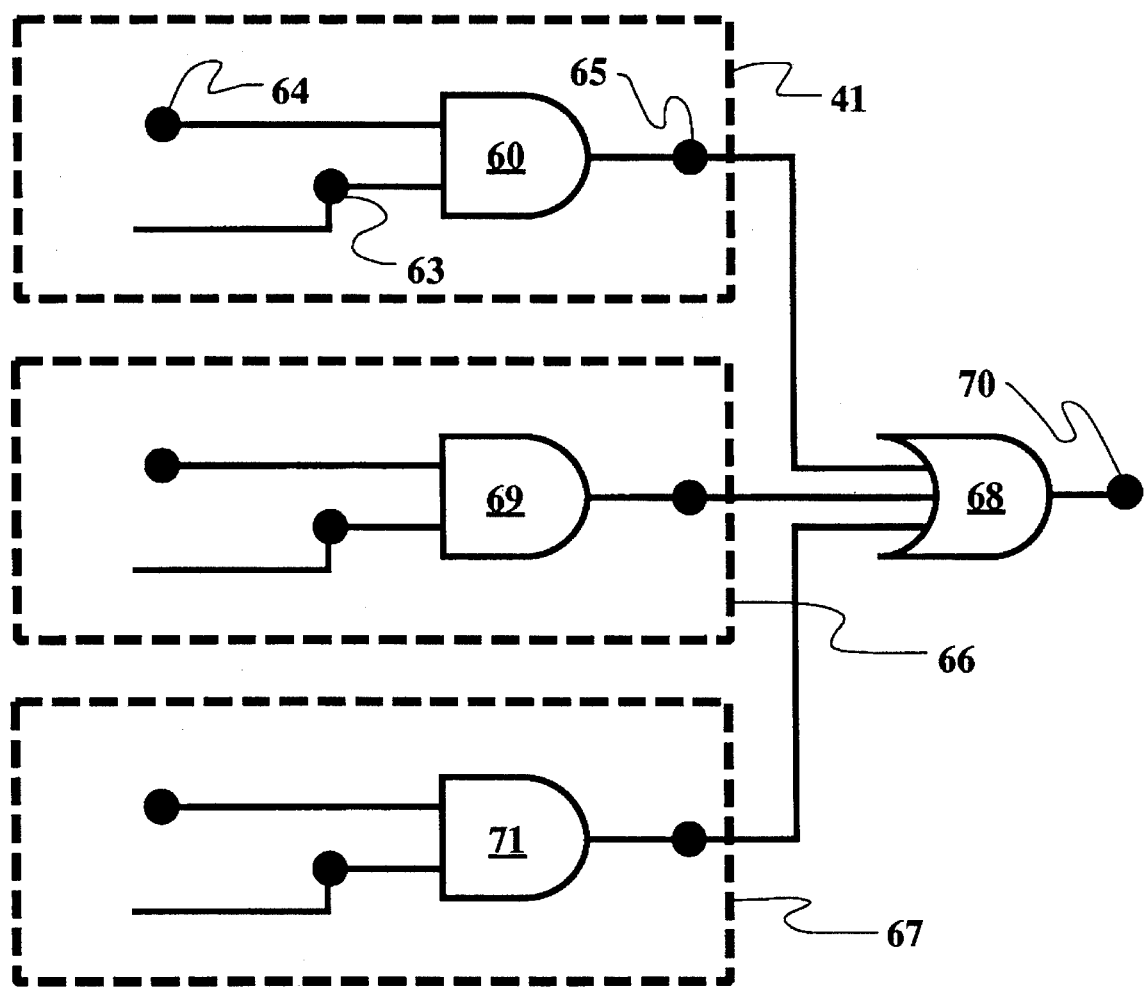
FIG. 3 is a block diagram illustrating multiple waveform generators OR gated together for providing signals indicative of multiple tones or vibrations and utilizing multiple interrupt devices for allowing selective interrupt of any of the waveform generators.

FIG. 3 illustrates one such system using multiple waveform generators 41, 66, and 67 which are OR gated, i.e., OR'ed together. The first generator 41 generates a cosine and a phase shifted wave for use in controlling a first tone or vibration. The second generator 66 is similar to the first except it is used for controlling a second tone or vibration, such as a second harmonic. Other generators can be used as well, such as generator 67. Each generator 41, 66, and 67 is OR'ed together by OR gate 68 to provide a signal to the processor at port 70. The signal from each generator 41, 66, and 67 may be selectively interrupted by controlling interrupt devices 60, 69, and 71 as needed.

Referring again to FIG. 2, the input source 22' may be further comprised of an external input or inputs 57 or internal input 58. The inputs 57 and 58 can be selectively alternated according to a control algorithm via a controller 59 to activate a switch. An example of an internal signal may be from an oscillator or the like. External inputs may be from accelerometers, force sensors, LVT's, LVDT's, microphones, tachometer, or the like. As mentioned above, the appropriate filtering, amplification, and/or conditioning for each type would be required.

A preferred use of this internal input 58 is for use by the LMS processor for identification of the plant. A processor (not shown) generates an internal input 58 to the waveform generator 41 and sweeps the frequency of this signal and directs one of the analog outputs, such as 40, to be output to the acoustic noise or force actuators of the LMS control system. The vibration or noise caused by the sweeping internal signal 59 is sensed by microphones or accelerometers and input to the error input of the LMS processor. This technique allows for the identification of the plant which is a necessary for proper operation of the LMS control algorithm.

Furthermore, as mentioned above, the 2×, or 4×, or other multiples or sub multiples (fractions of the input frequency) of the output of the frequency divider 30' could also be used to drive another waveform generator or generators. This would provide analog output signals of the proper order to cancel a multiple or multiples of the fundamental disturbance frequency of the input source. By way of example, this might be useful for cancellation of an N2 (second harmonic) tone in a jet engine or for canceling a 4P tone in a propeller driven aircraft.

While several embodiments of the present invention have been described in detail, various modifications, alterations, changes and adaptations to the aforementioned may be made without departing from the spirit and scope of the present invention defined in the appended claims. For example, each of the IC's may be replaced by discreet components such as logic gates, flip flops, and discreet transistors. It is intended that all such modifications, alterations, changes and adaptations be considered part of the present invention.

What is claimed is:

1. A waveform generator, comprising:
   (a) a phase-locked loop having a first phase-locked loop input for receiving an input signal from a source, a second phase-locked loop input, and a phase-locked loop output for outputting a multiplied square wave signal whose frequency is a multiple of a frequency of said input signal from said source;
   (b) a frequency divider having a frequency divider input for receiving said multiplied square wave signal from said phase-locked loop, a frequency divided output including at least one divided output signal, one of said at least one divided output signal being received by said second phase-locked loop input of said phase-locked loop; and
   (c) a first switched-capacitor filter having a first clock input for receiving said multiplied square wave signal from said phase-locked loop, a first switched-capacitor filter input of said first switched-capacitor filter for also receiving one of said at least one divided output signal, and a switched-capacitor filter output for outputting a first analog wave which is synchronized to said input signal from said source.

2. A waveform generator of claim 1, further including:
   (a) a second switched-capacitor filter having a second clock input for receiving said multiplied square wave signal from said phase-locked loop, a second switched-capacitor filter input, and a second switched-capacitor filter output for outputting a second analog wave, said second analog wave being phase shifted from said first analog wave yet is synchronized to said input signal; and
   (b) a shift register having a third clock input for receiving said multiplied square wave signal from said phase-locked loop, a shift register input for also receiving one of said at least one divided output signal from said frequency divider output, and a shift register output for outputting a phase shifted signal which is received in said second switch capacitor input of said second switched-capacitor filter.

3. A waveform generator of claim 2 wherein said first analog wave and said second analog wave are input to a processor of one of an active noise control system and an active vibration control system.

4. A waveform generator of claim 1 wherein said first analog wave is input to a processor of one of an active noise control system and an active vibration control system.

5. A waveform generator for generating at least two analog synchronized waveforms which are phase synchronized to a source, comprising:
   (a) a phase-locked loop having a first phase-locked loop input for receiving an input signal from said source, a second phase-locked loop input, and a phase-locked loop output adapted for outputting a multiplied square wave signal;
   (b) a frequency divider having a frequency divider input for receiving said multiplied square wave signal from said phase-locked loop, said frequency divider outputting a frequency divider output which includes at least one divided output signal, one of said divided output signal being received by said second phase-locked loop input of said phase-locked loop;
   (c) a first switched-capacitor filter having a first clock input for receiving said multiplied square wave signal from said phase-locked loop, a first switched-capacitor filter input for also receiving one of said at least one divided output signal from said frequency divider, and a first switched-capacitor filter output for outputting a first analog wave which is phase synchronized to said input signal from said source;
   (d) a second switched-capacitor filter having a second clock input for receiving said multiplied square wave signal from said phase-locked loop, a second switched-capacitor filter input, and a second switched-capacitor filter output for outputting a second analog wave which is phase shifted from said first analog wave; and
   (e) a shift register having an a third clock input for receiving said multiplied square wave signal from said phase-locked loop, a shift register input for also receiving one of said at least one divided output signal from said frequency divider, and a shift register output for outputting a phase shifted signal which is received in said second switched-capacitor filter input.

6. A waveform generator of claim 5 wherein said frequency divided output includes a 1× output and a second multiple of said input signal which is input to a processor to facilitate determination of the phase of said first analog wave.

7. A waveform generator of claim 5 wherein said frequency divided output includes a 4× output which is input to an interrupt device.

8. A waveform generator of claim 5 wherein said source is one of an external signal and an internal signal is determined by a switch operated by a control signal from a processor.

9. A waveform generator of claim 5 wherein said phase-locked loop for outputting a multiplied square wave signal includes a multiplier factor of 128.

10. A waveform generator of claim 5 wherein said shift register for outputting said phase shifted signal includes a shift of a predetermined number of counts out of an clock input count in order to cause a phase shift of said second analog waveform.

11. A waveform generator of claim 5 wherein said first analog wave is a cosine wave and said second analog wave is phase shifted therefrom.

12. A waveform generator of claim 5 wherein said first analog wave and said second analog wave are input to a processor.

13. A waveform generator of claim 5 wherein said first analog wave and said second analog wave are input to a processor of one of an active noise control system and an active vibration control system.

14. A waveform generator of claim 5 wherein said first analog wave and said second analog wave are input to a processor of an tonal noise control system.

15. A waveform generator of claim 5 wherein said first analog wave and said second analog wave are input to a processor of a tonal LMS noise control system.

16. A process of generating at least two analog synchronized waveforms which are synchronized to input signal derived from an input source, comprising the steps of:
  (a) inputting said input signal into a first phase-locked loop input of a phase-locked loop;
  (b) outputting a multiplied square wave signal to an input of a frequency divider, to a first clock input of a first switched-capacitor filter, to a second clock input of a second switched-capacitor filter, and to a third clock input of a shift register;
  (c) dividing said multiplied square wave signal in said frequency divider thereby providing a frequency divided output including at least one divided output signal and sending one of said at least one divided output signal to a second phase-locked loop input of said phased lock loop, to a shift register input of said shift register, and to a first switched-capacitor filter input of said first switched-capacitor filter;
  (d) receiving a shifted signal from said shift register into a second switched-capacitor filter input of said second switched-capacitor filter; and
  (e) outputting a first analog wave from said first switched-capacitor filter and a second analog wave from said second switched-capacitor filter, said first analog wave being synchronized with said input signal and said second analog wave being phase shifted from said first analog wave.

17. A waveform generator of claim 16 wherein said first wave is a cosine wave and said second wave is a phase shifted wave and are both input into a processor from the group of a LMS noise control system and a LMS vibration control system.

18. A waveform generator of claim 16 wherein said frequency divided output also provides a 1× signal and a 2× signal for use by a processor to determine the phase of said first analog wave and said second analog wave.

19. A waveform generator of claim 16 wherein said frequency divided output also provides a 4× signal for use by a processor to trigger said processor to calculate LMS adaptation coefficients.

20. A waveform generator of claim 16 wherein said frequency divided output also provides one of a multiple and submultiple signal for use as a synchronizing input to a second waveform generator for controlling a second harmonic of said input source.

21. A process of generating an analog waveform which is synchronized to a source, comprising the steps of:
  (a) inputting an input signal into a first phase-locked loop input of a phase-locked loop;
  (b) outputting a multiplied square wave signal to a frequency divider input of a frequency divider and also to a first clock input of a first switched-capacitor filter;
  (c) dividing said multiplied square wave signal in said frequency divider for providing a frequency divided output including at least one divided output signal and sending one of said at least one divided output signal to a second phase-locked loop input of said phased lock loop and to a first switched-capacitor filter input of said first switched-capacitor filter; and
  (d) outputting a first wave from said first switched-capacitor filter, said first wave being synchronized with said input signal.

22. A process of generating a waveform of claim 21 including the further steps of:
  (a) also outputting said multiplied square wave signal to a second clock input of a second switched-capacitor filter and to a third clock input of a shift register;
  (b) sending one of said at least one divided output signal to a shift register input of said shift register;
  (c) receiving a shifted signal from said shift register into a second switched-capacitor filter input of said second switched-capacitor filter; and
  (d) outputting a second wave from said second switched-capacitor filter, said second wave being phase shifted from said input signal.

* * * * *